(12) United States Patent
Kalnitsky et al.

(10) Patent No.: US 10,510,902 B2
(45) Date of Patent: Dec. 17, 2019

(54) MEMORY DEVICES AND METHODS OF MANUFACTURE THEREOF

(71) Applicant: Taiwan Semiconductor Manufacturing Company, Ltd., Hsinchu (TW)

(72) Inventors: Alexander Kalnitsky, San Francisco, CA (US); Hsiao-Chin Tuan, Taowan (TW); Felix Ying-Kit Tsui, Cupertino, CA (US); Hau-Yan Lu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/055,405

(22) Filed: Aug. 6, 2018

(65) Prior Publication Data

US 2018/0342624 A1 Nov. 29, 2018

Related U.S. Application Data

(62) Division of application No. 15/242,193, filed on Aug. 19, 2016, now Pat. No. 10,043,919, which is a division of application No. 13/715,641, filed on Dec. 14, 2012, now Pat. No. 9,431,107.

(51) Int. Cl.
| | | |
|---|---|---|
| *H01L 29/78* | (2006.01) | |
| *H01L 29/788* | (2006.01) | |
| *H01L 29/66* | (2006.01) | |
| *G11C 16/04* | (2006.01) | |
| *H01L 27/11524* | (2017.01) | |
| *H01L 29/06* | (2006.01) | |
| *H01L 29/423* | (2006.01) | |
| *H01L 27/11558* | (2017.01) | |

(52) U.S. Cl.
CPC ...... *H01L 29/7883* (2013.01); *G11C 16/0441* (2013.01); *H01L 27/11524* (2013.01); *H01L 29/0653* (2013.01); *H01L 29/42328* (2013.01); *H01L 29/66825* (2013.01); *H01L 29/7881* (2013.01); *H01L 27/11558* (2013.01)

(58) Field of Classification Search
CPC .......... H01L 29/7883; H01L 29/42328; H01L 29/0653; H01L 27/11524; H01L 29/7881; H01L 29/66825; H01L 27/11558; G11C 16/0441
See application file for complete search history.

(56) References Cited

U.S. PATENT DOCUMENTS

| | | | |
|---|---|---|---|
| 4,316,207 A | 2/1982 | Matsumoto | |
| 4,646,118 A | 2/1987 | Takemae | |
| 5,029,130 A | 7/1991 | Yeh | |
| 5,963,806 A | 10/1999 | Sung et al. | |

(Continued)

FOREIGN PATENT DOCUMENTS

| | | |
|---|---|---|
| KR | 20010084627 A | 9/2001 |
| KR | 20080056469 A | 6/2008 |

*Primary Examiner* — Moin M Rahman
(74) *Attorney, Agent, or Firm* — Slater Matsil, LLP

(57) ABSTRACT

Representative methods of manufacturing memory devices include forming a transistor with a gate disposed over a workpiece, and forming an erase gate with a tip portion extending towards the workpiece. The transistor includes a source region and a drain region disposed in the workpiece proximate the gate. The erase gate is coupled to the gate of the transistor.

20 Claims, 10 Drawing Sheets

(56) References Cited

U.S. PATENT DOCUMENTS

| | | | |
|---|---|---|---|
| 6,236,082 B1 * | 5/2001 | Kalnitsky | H01L 27/11553 |
| | | | 257/315 |
| 6,368,917 B1 | 4/2002 | Kalnitsky et al. | |
| 6,492,224 B1 * | 12/2002 | Jao | H01L 21/76229 |
| | | | 257/E21.008 |
| 2002/0000602 A1 | 1/2002 | Lee | |
| 2002/0177269 A1 | 11/2002 | Chou | |
| 2004/0056300 A1 | 3/2004 | Choi et al. | |
| 2008/0006868 A1 | 1/2008 | Hsu et al. | |
| 2008/0296647 A1 | 12/2008 | Tatsumi | |
| 2011/0286284 A1 | 11/2011 | Wang et al. | |
| 2012/0068304 A1 | 3/2012 | Kautzsch | |

* cited by examiner

MEMORY DEVICES AND METHODS OF MANUFACTURE THEREOF

CROSS-REFERENCE TO RELATED APPLICATIONS

This application is a divisional of U.S. patent application Ser. No. 15/242,193 filed on 19 Aug. 2016, entitled "Memory Devices and Methods of Manufacture Thereof," which is a divisional of U.S. patent application Ser. No. 13/715,641 filed on 14 Dec. 2012, entitled "Memory Devices and Methods of Manufacture Thereof," now U.S. Pat. No. 9,431,107, each application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Memory devices are one type of semiconductor device. Memory devices typically include an array of memory cells, with each memory cell being adapted to store digital information or data as a "1" or "0". Some memory devices are referred to as volatile memories because of their need to be refreshed to retain the data, while others are referred to as non-volatile memories (NVMs) because they do not require refreshing.

A recent development in NVMs is multiple-time programmable (MTP) NVMs, which are programmable multiple times. In comparison with high density NVM (such as flash memories or E2PROMS), MTP memories are suitable for low density applications, and are usually characterized by a larger memory cell size and a lower number of masking operations required to manufacture the memory cells.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to memory devices and methods of manufacturing thereof. Novel designs and structures of memory devices comprising MTP NVMs will be described herein.

Figure 1:
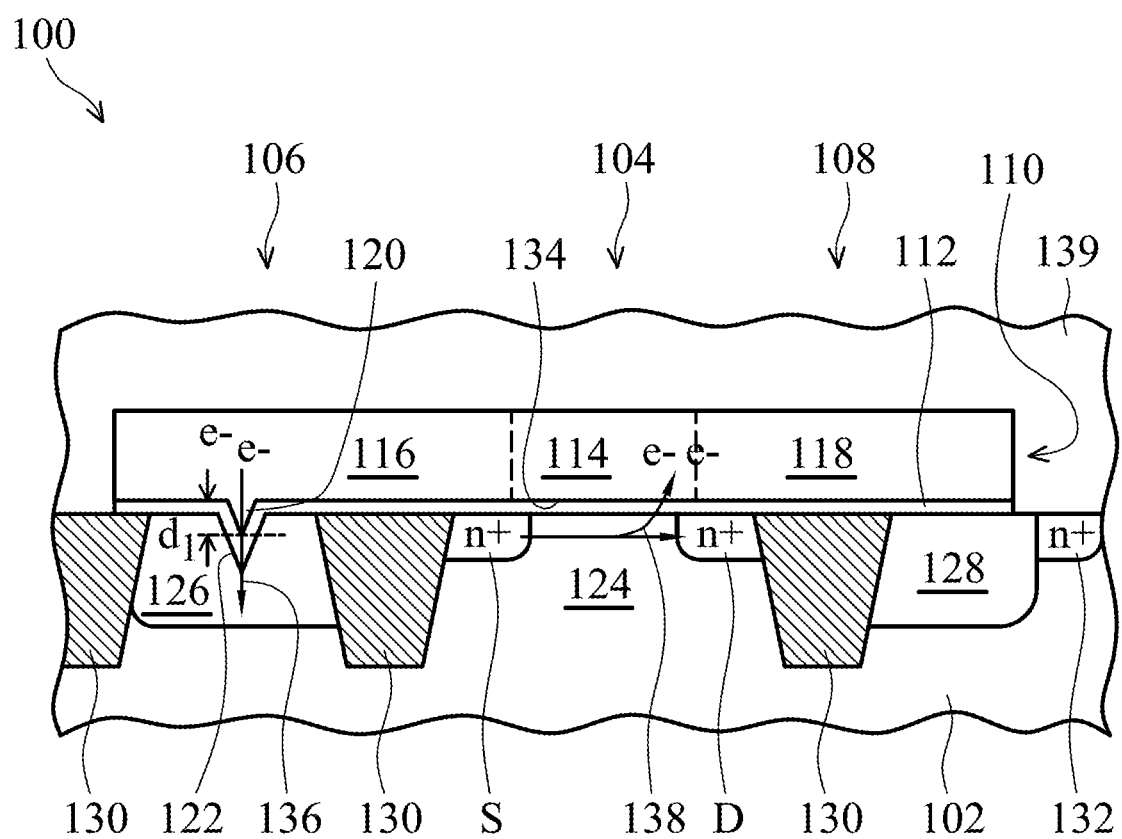
FIG. 1 illustrates a cross-sectional view of a memory device in accordance with some embodiments.

Referring first to FIG. 1, there is shown a cross-sectional view of a semiconductor device comprising a memory device 100 in accordance with some embodiments. The memory device 100 includes a transistor 104 having a source region S and a drain region D formed in a workpiece 102. The transistor 104 comprises a sense transistor including a floating gate 114 that is adapted to store a data state indicative of a "1" or "0" in some embodiments, for example. The memory device 100 also includes a first capacitor 106 comprising an erase gate and a second capacitor 108 comprising a coupling gate. The gate 114 of the transistor 104 is integrally connected the erase gate. The gate 114 of the transistor 104 is also integrally connected the coupling gate. A semiconductive material 110 is disposed over an insulating material 112 that is disposed over the workpiece 102. The semiconductive material 110 includes the gate 114 of the transistor 104, a plate 116 of the first capacitor 106, and a plate 118 of the second capacitor 108. The source region S and the drain region D of the transistor 106 are disposed in the workpiece 102 proximate the gate 114; e.g., proximate opposite sides of the gate 114.

A portion of the workpiece 102 comprises a channel region 124 of the transistor 104, wherein the channel region 124 is disposed between the source region S and the drain region D. The source and drain regions S and D may comprise n+ regions formed in the workpiece 102 in some embodiments. Another portion of the workpiece 102 comprises a plate 126 of the first capacitor 106, and yet another portion of the workpiece 102 comprises a plate 128 of the second capacitor 108. Plates 126 and 128 may comprise implantation regions implanted with dopant materials, such as n-type dopants, as an example. Plates 126 and 128 comprise cell erase capacitor and cell coupling capacitor regions, respectively, in some embodiments, as another example. Alternatively, p-type dopant materials can be used. The plate 128 of the second capacitor 108 may comprise an extension region 132 comprising a shallower implantation region than the implantation region of the plate 128 in some embodiments.

Plates 126 and 128 are also referred to herein (e.g., in some of the claims) as first plates, and plates 116 and 118 are also referred to herein as second plates, for example. The second plates 116 and 118 of the first capacitor 106 and the second capacitor 108, respectively, are coupled to the gate 114 of the transistor 104. The semiconductive material 110 comprises a continuous region of a semiconductive material that comprises the gate 114 and plates 116 and 118 in some embodiments, for example.

The second plate 116 of the first capacitor 106 includes a novel v-shaped portion 120 in a cross-sectional view that extends towards the workpiece 102 in some embodiments. The first capacitor 106 comprising the erase gate includes a v-shaped portion 120 in the cross-sectional view that extends towards the workpiece 102, and the erase gate 106 is coupled at the second plate 116 to the gate 114 of the transistor 104, for example. The v-shaped portion 120 of the second plate 116 of the first capacitor 106 facilitates in the erasure of the data state from the transistor 104 gate 114, to be described further herein. The v-shaped portion 120 of the second plate 116 of the first capacitor 106 is also referred to herein, e.g., in some of the claims, as a tip portion.

The workpiece 102 includes a region including a v-shaped recess 122 in the cross-sectional view in some embodiments. The region of the workpiece 102 including the v-shaped recess 122 comprises a region that the first capacitor 106 is formed in. The v-shaped recess 122 is also referred to herein as a recessed region of the workpiece 102 and a tip recess, e.g., in some of the claims. The v-shaped portion 120 of the second plate 116 of the first capacitor 106 extends towards the recessed region 122 of the workpiece 102 in some embodiments. The v-shaped portion 120 of the first capacitor 106 comprising the erase gate extends towards the recessed region 122 of the workpiece 102, for example.

The v-shaped portion 120 of the second plate 116 of the first capacitor 106 extends into the recessed region 120 of the workpiece 102 in some embodiments. The v-shaped portion 120 of the first capacitor 106 comprising the erase gate extends into the recessed region 122 of the workpiece 102, for example. The v-shaped portion 120 of the second plate 116 of the first capacitor 106 comprising the erase gate extends to a level that is below the level of a bottom surface 134 of the floating gate 114 by about 150 to 3,000 Angstroms in some embodiments, for example. Dimension $d_1$ comprising the height of the v-shaped portion 120 comprises about 50 to 3,000 Angstroms in some embodiments, for example. Alternatively, the v-shaped portion 120 of the second plate 116 of the first capacitor 106 comprising the erase gate may extend by an amount below the bottom surface 134 of the floating gate 114 comprising other dimensions.

The erasure and programming of the memory cell 100 are shown at 136 and 138, respectively, which will be described further herein.

Figure 2:
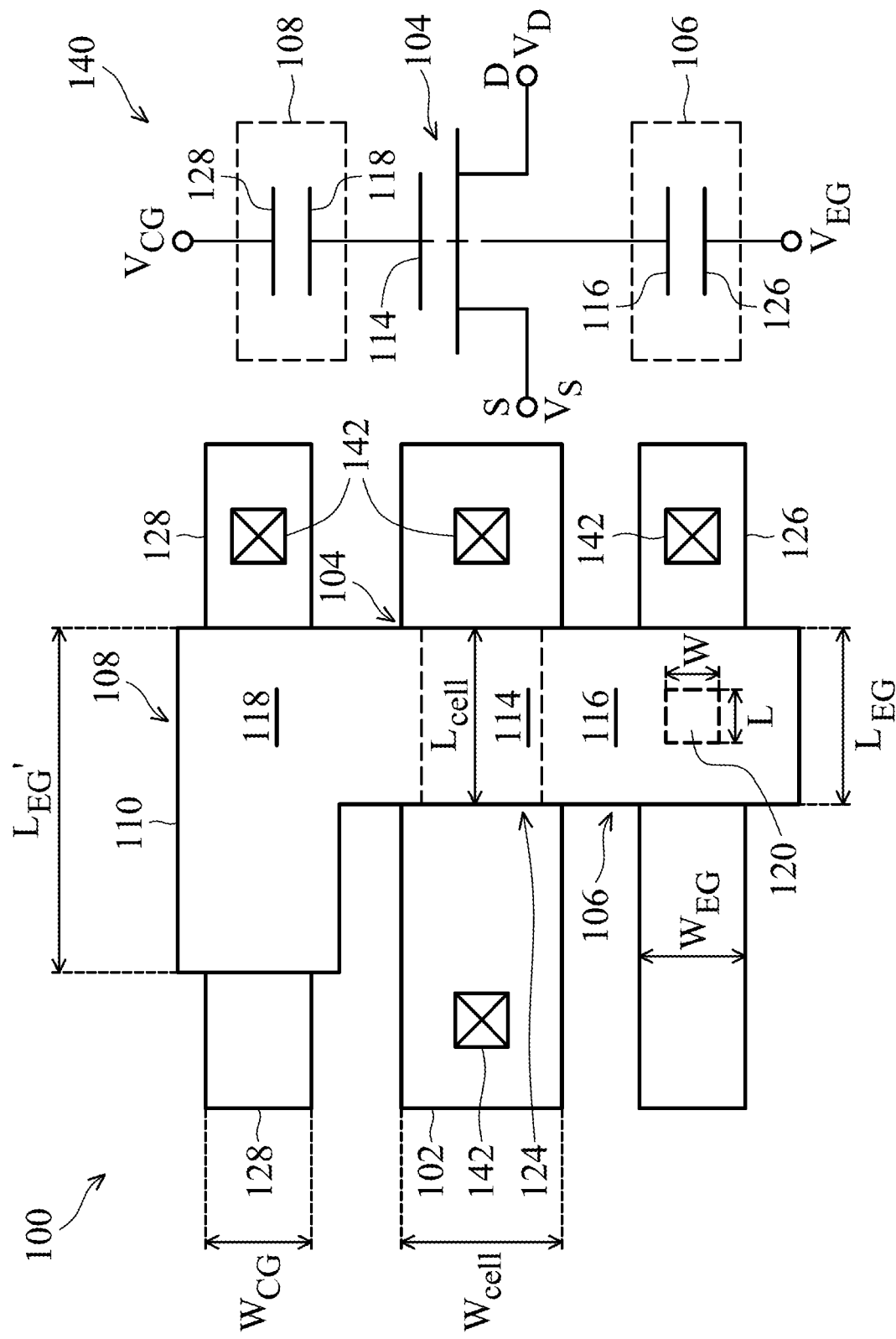
FIG. 2 shows a top view of a memory device and a schematic of the memory device in accordance with some embodiments.
Figure 3:
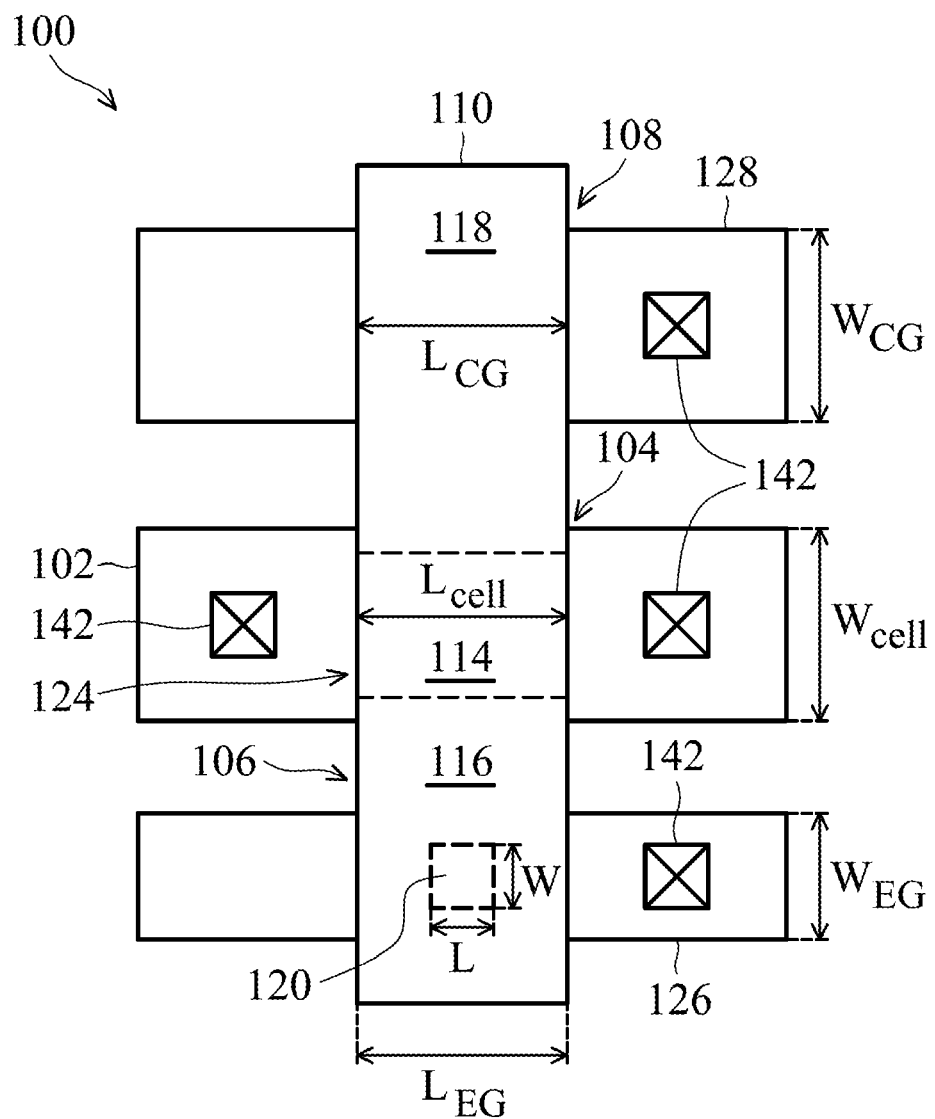
FIG. 3 shows a top view of a memory device in accordance with other embodiments.
Figure 4:
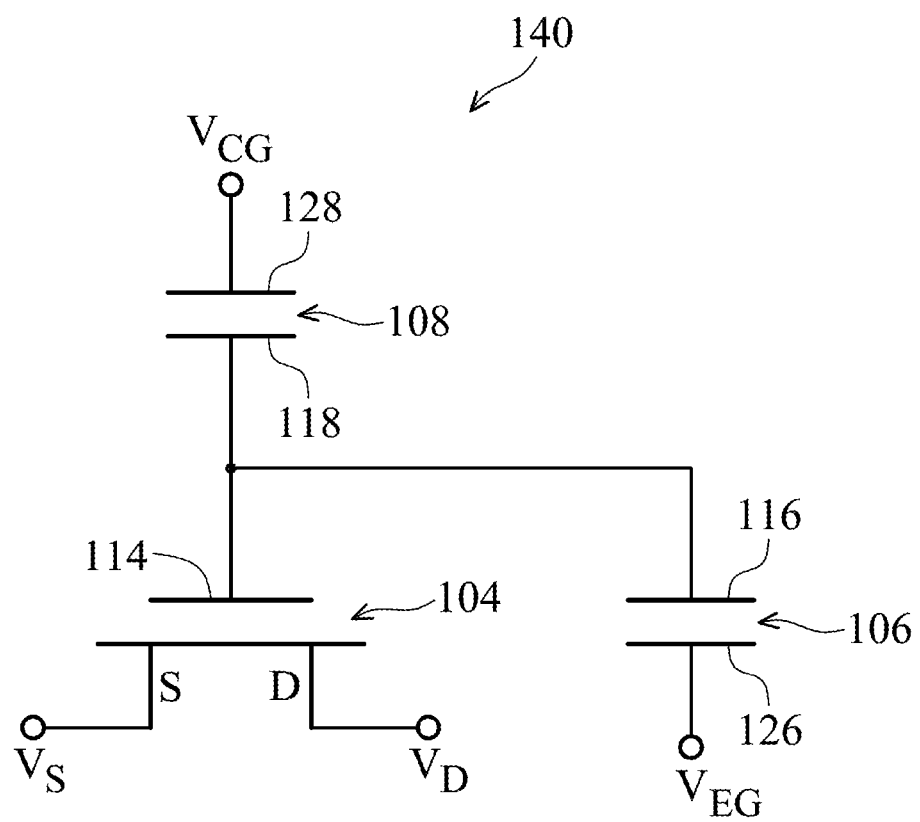
FIG. 4 is a schematic of a memory device in accordance with other embodiments.

FIG. 2 shows a top view of a memory device 100 and a schematic 140 of the memory device 100 in accordance with some embodiments. FIG. 3 shows a top view of a memory device 100, and FIG. 4 is a schematic 140 of a memory device 100, in accordance with other embodiments.

Referring again to FIG. 2, the transistor 104 in the top view of the memory device 100 is aligned alongside the transistor 104 of the schematic 140. Likewise, the first capacitor 106 and the second capacitor 108 are aligned alongside the first capacitor 106 and the second capacitor 108 of the schematic 140, respectively. The semiconductive material 110 has a greater length $L_{EG'}$ for the second plate 118 of the second capacitor 108 than the length $L_{EG}$ of the second plate 116 of the first capacitor 106 in the embodiments shown in FIG. 2. The length $L_{EG}$ of the second plate 116 of the first capacitor 106 comprises about 1 µm or less in some embodiments, as an example. In some embodiments, length $L_{EG}$ comprises about 0.5 µm, as another example. Length $L_{EG'}$ of the second plate 118 of the second capacitor 108 is about 2× (i.e., twice) the length $L_{EG}$ of the second plate 116 of the first capacitor 106, in some embodiments. In some embodiments, length $L_{EG'}$ comprises about 1.2 µm, as another example. The length of the cell $L_{cell}$ (i.e., the length of the gate 114 of the transistor 104) is substantially the same as the length of the second plate 116 of the first capacitor 106 in some embodiments. Alternatively, lengths $L_{EG}$, $L_{EG'}$, and $L_{cell}$ may comprise other dimensions or other relative dimensions.

The width $W_{EG}$ of the first plate 126 of the first capacitor 106 comprises about 1 µm or less in some embodiments, as an example. In some embodiments, width $W_{EG}$ comprises about 0.5 µm, as another example. The width $W_{CG}$ of the first plate 128 of the second capacitor 108 comprises about 1 µm or less in some embodiments, as an example. In some embodiments, width $W_{CG}$ is substantially the same as or less than the width $W_{EG}$ of the first plate 126 of the first capacitor 106, as another example. In some embodiments, width $W_{CG}$ comprises about 0.35 µm, as another example. The width $W_{cell}$ of the transistor 104 active area (e.g., the region of the workpiece 102 disposed under the gate 114) comprises about 2 µm or less in some embodiments, as an example. In some embodiments, width $W_{cell}$ comprises about 0.8 µm, as another example. Alliteratively, widths $W_{EG}$, $W_{CG}$, and $W_{cell}$ may comprise other dimensions or other relative dimensions.

Contacts and/or vias 142 are coupled to various portions of the memory device 100, such as the first plates 126 and 128 of the first and second capacitors 106 and 108, respectively, and the workpiece 102, to provide electrical connections to the memory device 100, as shown in FIG. 2. Contacts and/or vias 142 are also coupled to the source and drain regions S and D and gate 114 of the transistor 104 (and thus, also to the second plates 116 and 118 of the first and second capacitors 106 and 108, respectively), not shown. The contacts and/or vias 142 are electrically coupled to conductive lines, contact pads, and/or terminals in subsequently formed upper metallization levels of the memory device 100, for example, also not shown.

An upper portion of the v-shaped region 120 of the second plate 116 of the first capacitor 106 comprises a length L and a width W in a top view, wherein length L and width W comprise about 0.5 µm or less in some embodiments. A lower portion of the v-shaped region 120 of the second plate 116 proximate a point of the v-shaped region 120 comprises a dimension ranging from about 0.1 to about 0.2 µm in some embodiments. Alternatively, the dimensions L, W, and the lower pointed portion of the v-shaped region 120 may comprise other values.

The v-shaped region 120 is sown as square in the top view of FIG. 2. Alternatively, the v-shaped region 120 may comprise other shapes in a top view. The v-shaped region 120 may comprise a rectangle, circle, oval, triangle, trapezoid, octagon, other geometric shapes, other asymmetric or symmetric shapes, or other shapes in a top view, not shown in the drawings.

FIG. 3 shows a top view of a memory device 100 in accordance with other embodiments, wherein the semiconductive material 110 comprises substantially the same length for the entire width of the semiconductor material 110 in these embodiments. For example, lengths $L_{EG}$, $L_{EG'}$, and $L_{cell}$ are substantially the same in the embodiments shown in FIG. 3. Widths $W_{CG}$ and $W_{cell}$ are substantially the same and are greater than width $W_{EG}$.

The schematics 140 shown in FIGS. 2 and 4 illustrate the electrical connections and functions of the various components of the memory devices 100 described herein. The capacitors 106 and 108 are coupled in series, each with a second plate 116 and 118, respectively, coupled to the gate 114 of the transistor 104. A voltage terminal $V_{CG}$ is coupled to the first plate 128 of the second capacitor 108, and a voltage terminal $V_{EG}$ is coupled to the first plate 126 of the first capacitor 106. A voltage terminal $V_S$ is coupled to the source region S, and a voltage terminal $V_D$ is coupled to the drain region D of the transistor 104. A voltage terminal $V_{sub}$ is also coupled to the workpiece 102 (see FIG. 1) in some embodiments, not shown in the schematic 140. The voltage terminals $V_{CG}$, $V_{EG}$, $V_S$, $V_D$, and $V_{sub}$ may comprise conductive lines, contact pads, and/or terminals in upper levels of the memory device 100 that are coupled to the various regions of the memory device 100 using the contacts and/or vias 142 shown in the top views in FIGS. 2 and 3, for example.

The memory devices 100 described herein comprise multiple-time programmable (MTP) non-volatile memory (NVM) cells or devices. The operation of the memory devices 100, which includes erasing, programming, and reading the memory devices 100 will next be described. Referring again to FIG. 1, the memory device 100 is erasable using the first capacitor 106. The v-shaped portion 120 of the second plate 116 of the first capacitor 106 comprises an erase tip in some embodiments, for example. The gate 114 of the transistor 104 is adapted to store a bit of information, and the bit of information is erasable using the erase tip 120 of the second plate 116 of the first capacitor 106, for example.

In an erase operation, the transistor 104 is erased using Fowler-Nordheim (FN) tunneling by applying a voltage of about 0 volts to the workpiece 102 ($V_{sub}$), and to voltage terminals $V_{CG}$, $V_D$, and $V_S$, and applying a positive voltage of about 7 to 12 volts to terminal $V_{EG}$ (see also schematics 140 in FIG. 2 and FIG. 4.) Applying these voltages causes FN tunneling 136 (see FIG. 1) in the first capacitor 106, which erases the negative charge, if present, on the floating gate 114 of the transistor 104. Any trapped electrons (e⁻) present on the floating gate 114, which is electrically coupled to the second plate 116 of the first capacitor 106, migrate through the insulating material 112 to the first plate 126 of the first capacitor 106 due to the FN tunneling 136. The FN tunneling 136 affect pulls the electrons out of the gate 114. The pointed shape of the v-shaped portion 120 of the second plate 116 of the first capacitor 106 advantageously reduces the amount of tunneling voltage required to erase the charge on the floating gate 114 of the transistor 104, for example. The sharp pointed tip of the v-shaped portion 120 of the second plate 116 of the first capacitor 106 increases the electric field of the FN tunneling 136 so that a lower amount of voltage (e.g., the 7 to 12 volts applied to the voltage terminal $V_{EG}$) can be used to erase the memory device 100 in some embodiments, advantageously. Alternatively, in other embodiments, the data stored on the transistor 104 may be erased using other methods, voltages, and voltage terminals.

The floating gate 114 of the transistor 104 is programmable and readable using the second capacitor 108. The floating gate 114 of the transistor 104 is programmable by channel hot electron (CHE) carrier injection 138. First, a convention can be established for a memory array for determining a "1" or "0" state of the memory device 100. A programmed transistor 104 can be established to represent a "1", and an unprogrammed transistor 104 can be established to represent a "0". Or alternatively, an unprogrammed transistor 104 can be established to represent a "1", and a programmed transistor 104 can be established to represent a "0". In either case, a programmed or unprogrammed state of the floating gate 114 can be sensed by determining if the floating gate 114 is positively (unprogrammed or erased) or negatively (programmed) charged.

In a programming operation, a voltage of about 5 to 8 volts is applied to voltage terminals $V_{CG}$, $V_{EG}$, and $V_D$, and a voltage of about 0 volts is applied to voltage terminal $V_S$, causing a relatively low amount of current (e.g., about 1 to 20 µAmperes) to flow through the transistor 104 from the source region S to the drain region D and migrate to the floating gate 114. The electrons (e⁻) from the source region S accelerate and become heated due to CHE carrier injection 138, and the electrons migrate through the insulating material 112 to the floating gate 114 of the transistor 104. The trapped electrons on the floating gate 114 have a negative charge and lower the potential of the gate 114.

In a read operation, the data stored in the transistor 104 is sensed by applying a voltage of about 2.3 volts to voltage terminal $V_{EG}$, applying a voltage of about 0.8 volts to terminal $V_D$, and applying a sweep voltage ranging from about 0 to 2.3 volts to terminal $V_{CG}$ (e.g., each memory cell in an addressed portion of the array is read by applying a voltage of 2.3 volts to each addressed memory cell) and applying a voltage of about 0 volts to voltage terminal $V_S$ and $V_{sub}$. The drain current indicating the amount of charge stored in the gate 114 of the transistor 104 is detected by a sense amplifier (not shown). If the floating gate 114 is positively charged (e.g., unprogrammed), the channel region 124 directly beneath the floating gate 114 is normally turned on. When a read operation is performed, if electrical current flows from the drain region D to the source region S, the memory device 100 is sensed at an erased or unprogrammed state. However, if the floating gate 114 is negatively charged (e.g., programmed), the region of the channel 124 beneath the floating gate 114 is either weakly turned on or is entirely shut off. Thus, when the drain region D is raised to a read potential of about 0.8 volts, the current through the channel 124 remains either very small or non-existent compared to the erased state, and the memory device 100 is sensed at a programmed state.

Alternatively, in other embodiments, the floating gate 114 of the transistor 104 of the memory devices 100 may be programmed and/or read using other methods, voltages, currents, and/or voltage terminals.

FIGS. 5 through 8 are cross-sectional views of a memory device 100 at various stages of manufacturing in accordance with some embodiments, wherein an additional masking step and lithography step is used to form the recessed regions 122 of the workpiece 102. In some embodiments, the STI regions 130 are first formed in the workpiece 102, and second, the v-shaped recess 122 is formed in the workpiece 102, as shown in FIGS. 5 through 8. In other embodiments, the v-shaped recess 122 is first formed in the workpiece 102, and second, the STI regions 130 are formed in the workpiece 102, not shown in the drawings.

To manufacture the memory device 100, first, the workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

Figure 5:
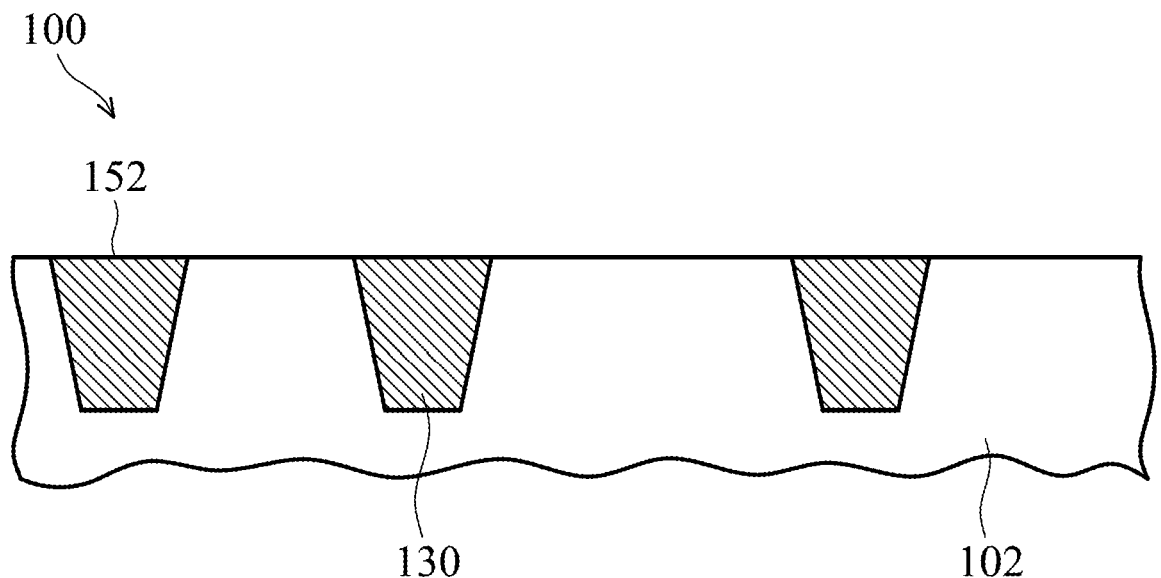
FIGS. 5 through 8 are cross-sectional views of a memory device at various stages of manufacturing in accordance with some embodiments.

STI regions 130 are formed in the workpiece 102. The STI regions 130 are formed by etching recesses in the workpiece 102 using an etch process, and filling the recesses with an insulating material 152. The insulating material 152 may comprise silicon dioxide, silicon nitride, other insulators or materials, or combinations or multiple layers thereof. Excess insulating material 152 is removed from over a top surface of the workpiece 102 using a chemical-mechanical polishing (CMP) and/or etch process, as examples, leaving the STI regions 130 comprising the insulating material 152 formed in the workpiece 102, as shown in FIG. 5.

Figure 6:
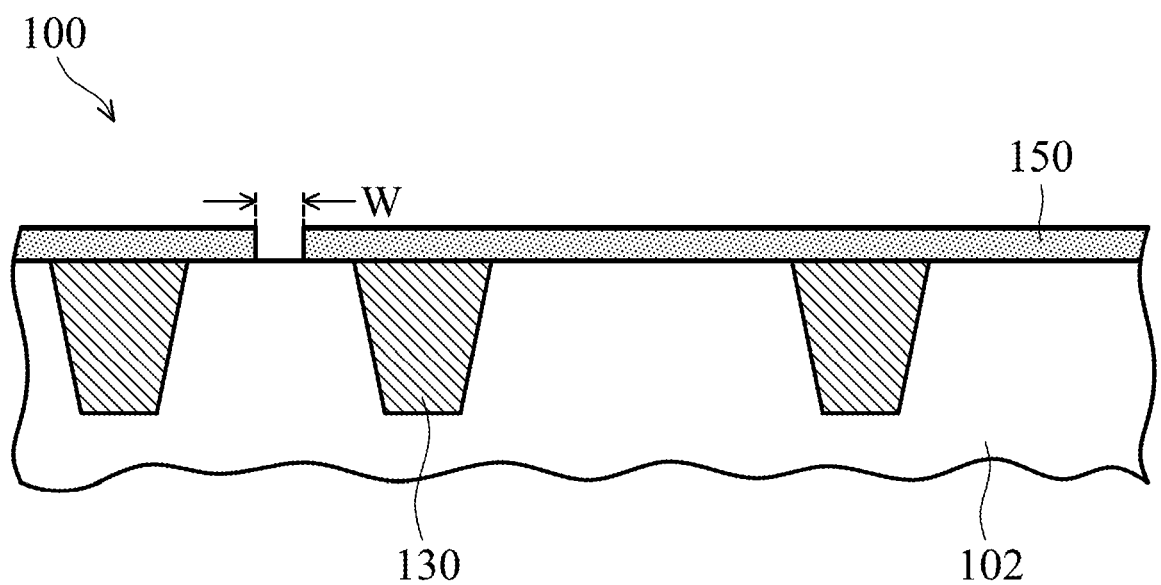
Figure 7:
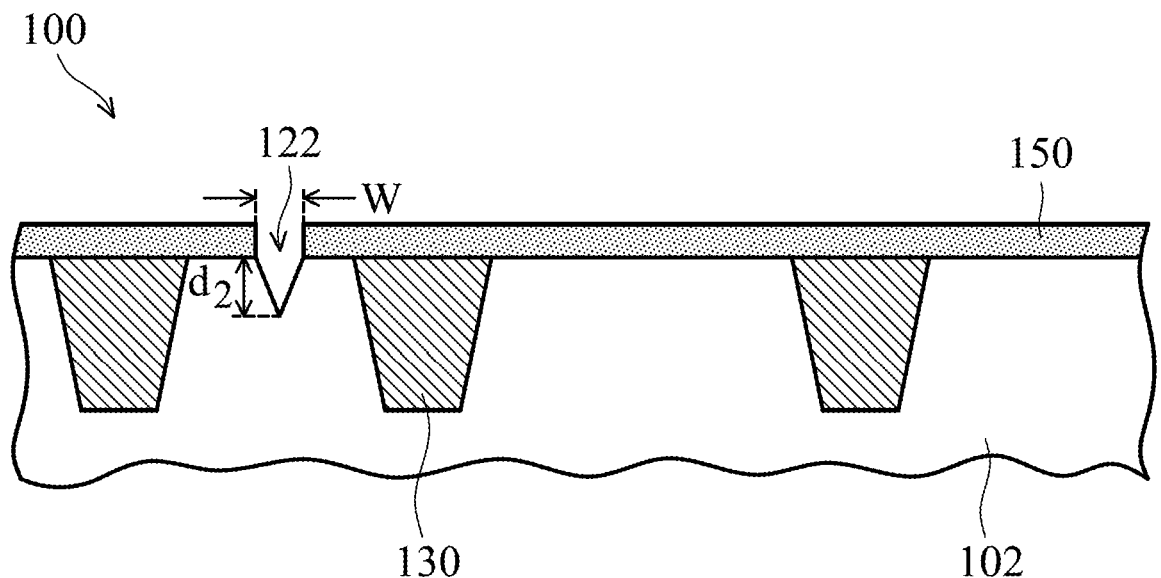

A masking material 150 is formed over the workpiece 102, as shown in FIG. 6. The masking material 150 comprises a layer of photoresist and/or a hard mask material, as examples. The masking material 150 is patterned with a desired pattern for the recesses 122 using a lithography process, also shown in FIG. 6, and the workpiece 102 is etched using the masking material 150 as an etch mask to form the v-shaped recess 122, as shown in FIG. 7. The v-shaped recess 122 comprises a width W at a top portion thereof as previously described herein. The v-shaped recess 122 comprises a depth within the workpiece 102 comprising dimension $d_2$, wherein dimension $d_2$ comprises about 0.2 µm or less, as an example. Alternatively, dimension $d_2$ may comprise other values. The masking material 130 is then removed using an ashing and/or etch process, as shown in FIG. 8.

Figure 8:
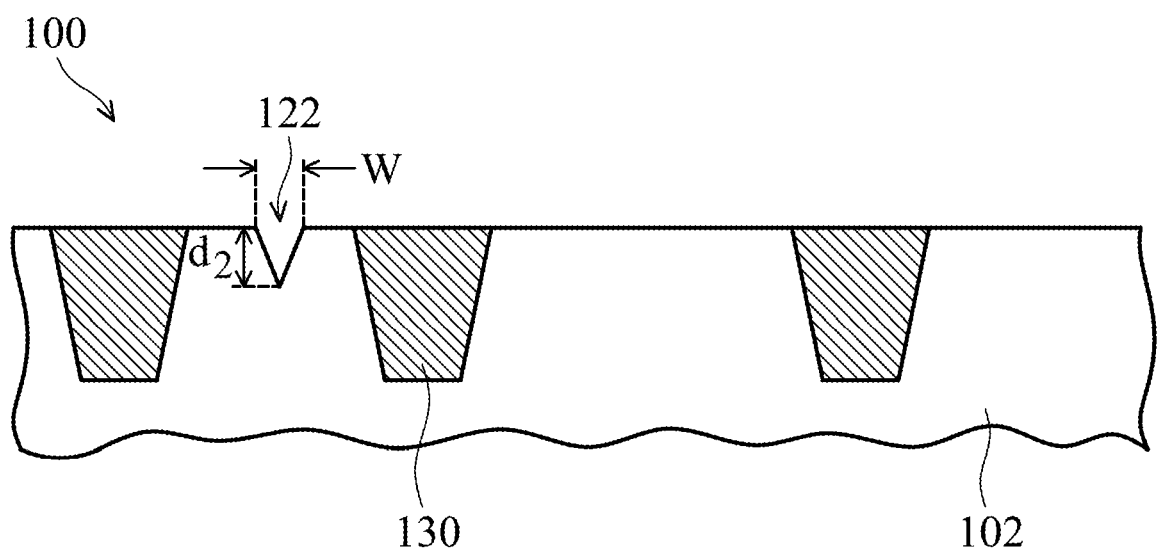

In the embodiments shown in FIGS. 5 through 8, the STI regions 130 can be formed before, or after (not shown), the v-shaped recess 122 is formed. For example, to form the STI regions 130 after forming the v-shaped recess 122, in FIG. 6, the masking material 150 can be formed over the workpiece 102 before the STI regions 130 are formed. The processing steps described for FIGS. 6 and 8 are performed, and then the STI regions 130 are formed. The insulating material 152 of the STI regions (see FIG. 5) is then removed from the v-shaped recess 122 using a sacrificial or native oxide removal step or an additional lithography process.

FIGS. 9 through 12 illustrate cross-sectional views of a memory device 100 at various stages of manufacturing in accordance with other embodiments, wherein an existing masking step and lithography step is used to form the recessed regions 122 in the workpiece 102. No additional lithography masks, etch masks, or lithography processes are required in some of these embodiments, advantageously, and the v-shaped recess 122 is self-aligned, e.g., with the STI regions 130. The STI regions 130 and the v-shaped recess 122 are formed simultaneously in these embodiments.

Figure 9:
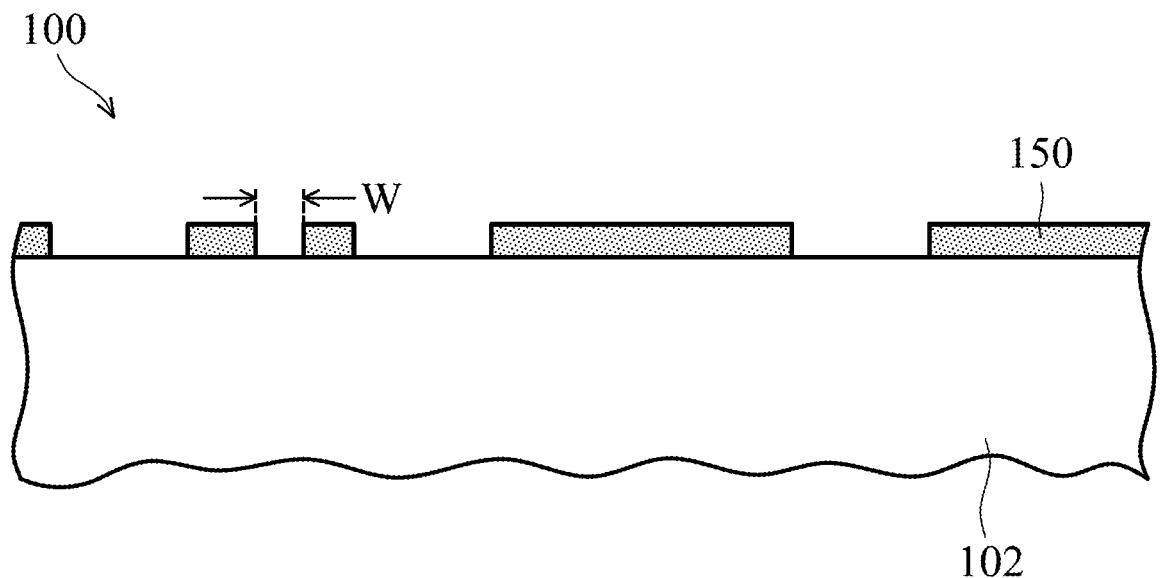
FIGS. 9 through 12 illustrate cross-sectional views of a memory device at various stages of manufacturing in accordance with other embodiments.
Figure 10:
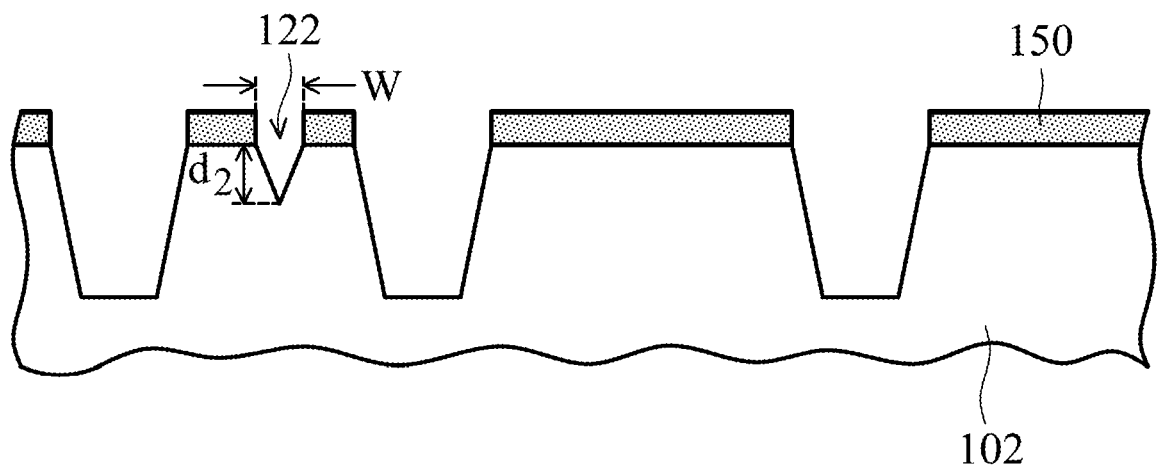
Figure 11:
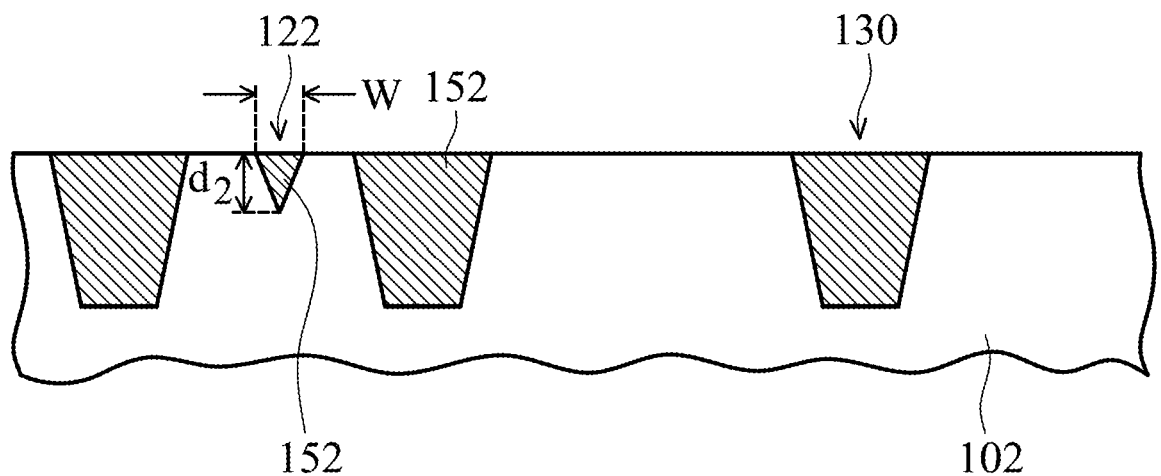

The STI regions 130 and the v-shaped recess 122 are formed by forming a masking material 150 over the workpiece 102, as shown in FIG. 9. The masking material 150 is patterned using a lithography process, forming patterns for the STI region 130 recesses and also the v-shaped recess 122. The patterns are larger for the STI regions 130, and the patterns for the v-shaped recess 122 comprise a width W. The workpiece 102 is etched using the masking material 150 as an etch mask to form the v-shaped recess 122 and the recesses for the STI regions 130, as shown in FIG. 10. Because the width W of the pattern in the masking material 150 for the v-shaped recess 122 is less than the width of the patterns for the STI regions 130, the recesses for the STI regions 130 are deeper than the v-shaped recess 122. The masking material 150 is removed, as shown in FIG. 11, and an insulating material 152 is formed over the workpiece 102.

Figure 12:
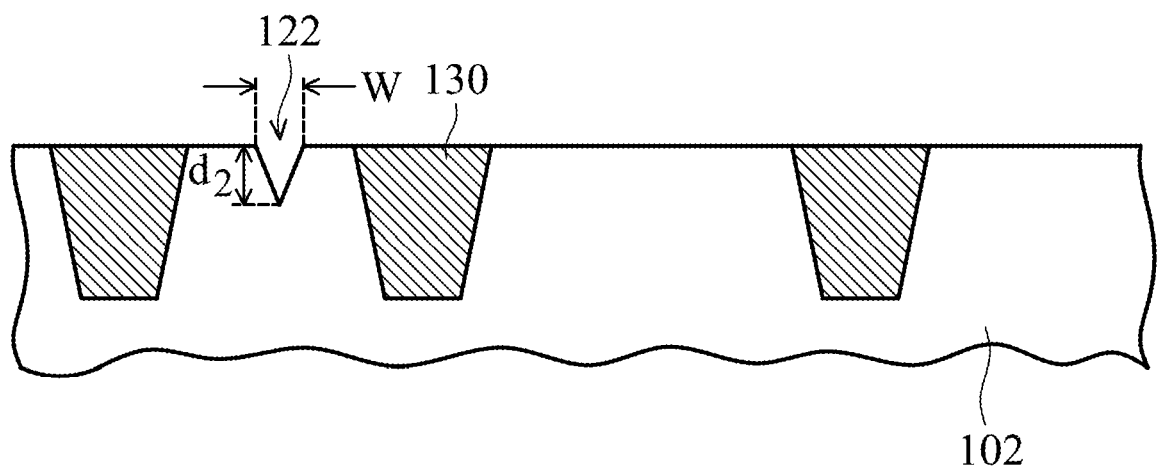

The insulating material 152 fills the v-shaped recess 122 and the recesses for the STI regions 130. In some embodiments, the insulating material 152 also covers the top surface of the workpiece 102 as-deposited, not shown. The insulating material 152 is removed from over the top surface of the workpiece 102 using a CMP process and/or etch process, as shown in FIG. 11. The insulating material 152 is removed from the v-shaped recess 122, as shown in FIG. 12.

The insulating material 152 is removed from the v-shaped recess 122 using a sacrificial or native oxide removal process in some embodiments. In other embodiments, an additional lithography process can be used to remove the insulating material 152 from the v-shaped recess 122, by depositing another masking material, patterning the masking material to expose the insulating material 152 in the v-shaped recess 122, and using an etch process to remove the insulating material 152 from the v-shaped recess 122, not shown.

Figure 13:
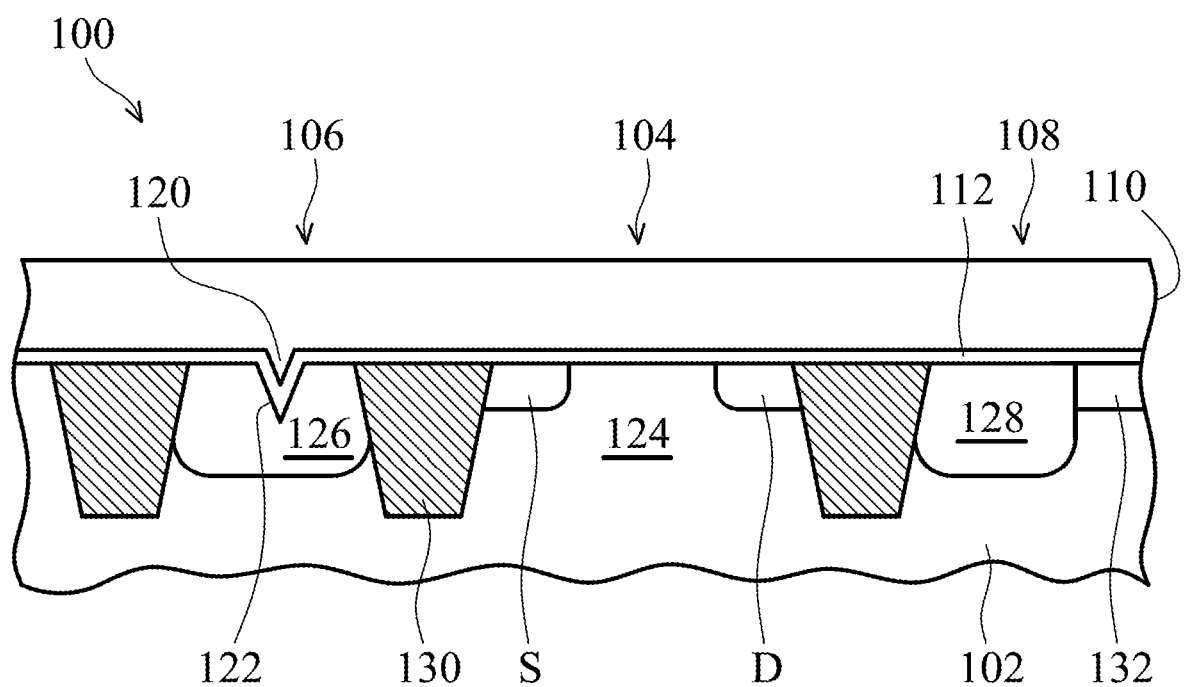
FIG. 13 is a cross-sectional view of a memory device in accordance with some embodiments after the manufacturing steps shown in FIG. 8 or FIG. 12.

FIG. 13 is a cross-sectional view of a memory device 100 in accordance with some embodiments. After the manufacturing process steps shown in FIG. 8 or FIG. 12, an implantation process (or processes) is used to form the source region S and drain region D of the transistor 104, the first plates 126 and 128 of the first and second capacitors 106 and 108, respectively, and the extension region 132 proximate the second plate 128 of the second capacitor 108. An insulating material 112 is formed over the top surface of the workpiece 102. The insulating material 112 lines the recessed region 122 of the workpiece 102, partially filling the recessed region 122 in some embodiments. In other embodiments, the insulating material 112 completely fills the recessed region 122 of the workpiece 102, as another example. The insulating material 112 is substantially conformal in some embodiments, having substantially the same topography as the workpiece 102 top surface, for example. The insulating material 112 comprises silicon dioxide in some embodiments, as an example. The insulating material 112 comprises a thickness of about 70 Angstroms or greater in some embodiments. In some embodiments, the insulating material 112 comprises a thickness of about 120 to 130 Angstroms, as another example. The insulating material 112 is formed using an oxidation process in some embodiments. Alternatively, the insulating material 112 may comprise other materials and dimensions, and other methods may be used to form the insulating material 112.

The semiconductive material 110 is formed over the insulating material 112, also shown in FIG. 13. The semiconductive material 110 comprises polysilicon (poly) having a thickness of about 1,000 Angstroms or more for example. Alternatively, the semiconductive material 110 may comprise other materials and dimensions.

The semiconductive material 110 is then patterned using lithography to form a desired shape of the gate 114 and second plates 116 and 118 of the memory device 100, as shown in FIG. 1 in the cross-sectional view, and as shown in the top views in FIGS. 2 and 3. In some embodiments, the insulating material 112 is also patterned using the lithography process, as illustrated in FIG. 1. In other embodiments, the insulating material 112 is not patterned. The manufacturing process for the memory device 100 is then continued, such as forming additional insulating and/or passivation layers 139 and forming contacts and/or vias 142 (see FIGS. 2 and 3) that are coupled to various regions of the memory device 100, such as the plates 126 and 128 of the capacitors 106 and 108, the workpiece 102, and source region S and drain region D of the transistor 140 (and also to the gate 114 of the transistor 104, as another example, not shown).

Only one memory device 100 is shown in the drawings; however, in some applications, a plurality of the memory devices 100 is manufactured across the workpiece 102 simultaneously. The memory devices 100 may be arranged in an array, and word lines and bit lines may be formed proximate the array to access the memory devices 100, not shown in the drawings. Alternatively, the plurality of the memory devices 100 may be arranged in other shapes, and the memory devices 100 may be addressed using other methods and structures. Each memory array and any associated peripheral or support circuitry is singulated from others formed across the workpiece 102.

Figure 14:
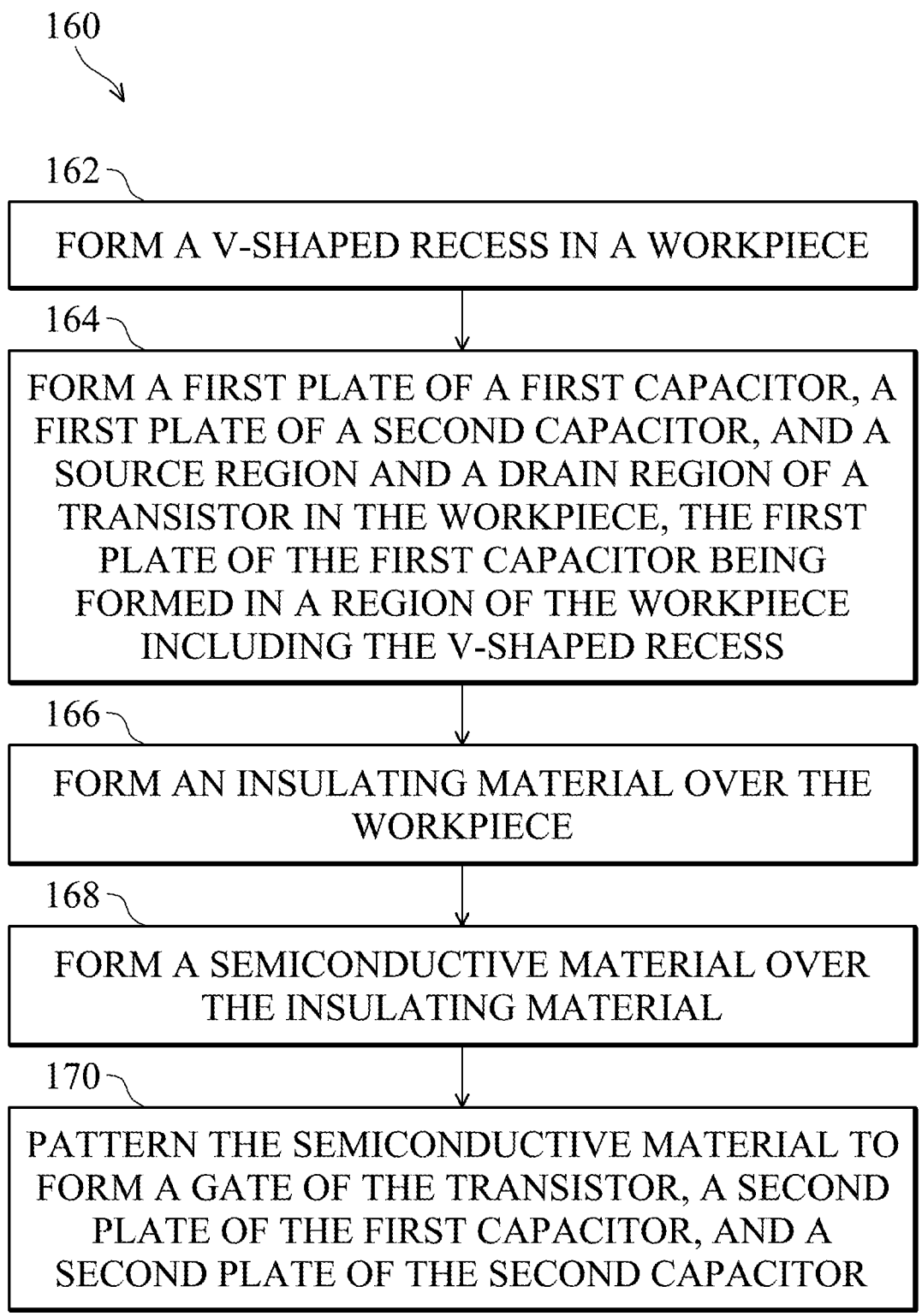
FIG. 14 is a flow chart illustrating a method of manufacturing a semiconductor device in accordance with some embodiments.

FIG. 14 is a flow chart 160 illustrating a method of manufacturing a memory device 100 in accordance with an embodiment. In step 162, a v-shaped recess 122 is formed in a workpiece 102. In step 164, a first plate 126 of a first capacitor 106 is formed, a first plate 128 of a second capacitor 108 is formed, and a source region S and a drain region D of a transistor 104 is formed in the workpiece 102. The first plate 126 of the first capacitor 116 is formed in a region of the workpiece 102 including the v-shaped recess 122. In step 166, an insulating material 112 is formed over the workpiece 102. In step 168, a semiconductive material 110 is formed over the insulating material 112. In step 170, the semiconductive material 110 is patterned to form a gate 114 of the transistor 104, a second plate 116 of the first capacitor 106, and a second plate 118 of the second capacitor 108.

Some embodiments of the present disclosure include methods of manufacturing memory devices 100. Other embodiments include memory devices 100 manufactured using the methods described herein and including the novel v-shaped recesses 122 and v-shaped portions 120 of the second plate 116 of the first capacitor 106.

The novel MTP NVM devices 100 described herein have useful application in storing program code and/or data on system-on-a chip (SoC) applications, as a substitute for external flash memory devices, or replacements for read-only memory (ROM) devices, programmable ROM (PROM) devices, erasable PROM (EPROM) devices, electrically erasable PROM (EEPROM) devices, and other types of memory devices, as examples.

Advantages of some embodiments of the disclosure include providing novel memory devices 100 having a v-shaped erase gate. Novel v-shaped poly-to-substrate [e.g., (the semiconductive material 110)-to-(the first plate 126 of the first capacitor 106 formed in the workpiece 102)] erase tips for NVMs are disclosed. The novel memory devices 100 have the ability to be erased or programmed at relatively low voltage levels. The novel v-shaped erase gates can accomplish erasures at voltage levels of around 7 to 12 volts, for example.

In some embodiments, the v-shaped erase gate is self-aligned and an additional lithography mask and process is not required, which is an advantage because an additional mask required to create a thin tunneling oxide is avoided. In other embodiments, one or two additional lithography masks and processes can be used to form the v-shaped recess 122, which results in the subsequent formation of a v-shaped portion 120 of the second plate 116 of the first capacitor 106 comprising the erase gate.

The pointed tip of the v-shaped portion 120 of the erase gate facilitates in the erasure of the programming state of the memory device 100. Less tunneling voltage is required for the FN tunneling erase function due to the pointed erase tip comprising the v-shaped portion 120 of the erase gate. The sharp point advantageously creates a higher electric field during the FN tunneling erasure. The erase tip uses a small area of the erase gate (e.g., only a portion of the second plate 116 of the first capacitor 106), resulting in less layout dependence for correct alignment.

The pointed erase tip reduces a potential for over-erase issues by providing a tip self-stop discharge, due to the pointed shape. This is particularly advantageous in some applications, because the use of an additional select gate to overcome such over-erase issues can be avoided. The pointed erase tip also requires less substrate current for erasure of the memory devices 100, providing a more reliable environment to other circuitry on the semiconductor device. The novel erase tip also has improved data retention performance, because the insulating material 112 can be thicker for a given erase voltage.

Furthermore, the novel memory devices 100 and manufacturing methods described herein are easily implementable in manufacturing process flows. In some embodiments, no additional lithography masks or lithography processes are required.

In accordance with some embodiments of the present disclosure, a memory device includes a transistor including a gate disposed over a workpiece, and a source region and a drain region disposed in the workpiece proximate the gate. The memory device includes an erase gate including a tip portion that extends towards the workpiece. The erase gate is coupled to the gate of the transistor.

In accordance with other embodiments, a memory device includes a first capacitor, a second capacitor coupled in series with the first capacitor, and a transistor including a gate coupled to the first capacitor and the second capacitor. The first capacitor includes a first plate disposed in a workpiece, an insulating material disposed over the workpiece, and a second plate disposed over the insulating material. The second plate of the first capacitor includes a tip portion that extends towards the workpiece.

In accordance with other embodiments, a method of manufacturing a memory device includes forming a tip recess in a workpiece, and forming a first plate of a first capacitor, a first plate of a second capacitor, and a source region and a drain region of a transistor in the workpiece. The first plate of the first capacitor is formed in a region of the workpiece including the tip recess. The method includes forming an insulating material over the workpiece, and forming a semiconductive material over the insulating material. The semiconductive material is patterned to form a gate of the transistor, a second plate of the first capacitor, and a second plate of the second capacitor. The tip recess comprises a v-shape in a cross-sectional view.

In a representative embodiment, a method of manufacturing a memory device comprises: forming a tip recess in a workpiece; forming a first plate of a first capacitor, a first plate of a second capacitor, and a source region and a drain region of a transistor in the workpiece, the first plate of the first capacitor being formed in a region of the workpiece including the tip recess; forming an insulating material over the workpiece; forming a semiconductive material over the insulating material; and patterning the semiconductive material to form a gate of the transistor, a second plate of the first capacitor, and a second plate of the second capacitor, wherein the tip recess comprises a v-shape in a cross-sectional view, and the second plate of the first capacitor includes a tip portion that extends into the tip recess. The method may further comprise forming a plurality of shallow trench isolation (STI) regions in the workpiece; wherein the method comprises first, forming the plurality of STI regions and second, forming the tip recess; or wherein the method comprises first, forming the tip recess, and second, forming the plurality of STI regions. The step of forming the tip recess may comprise forming a masking material over the workpiece, patterning the masking material, etching the workpiece using the masking material as an etch mask to form the tip recess, and removing the masking material. The method may further comprise forming a plurality of shallow trench isolation (STI) regions in the workpiece, and wherein the method further comprises forming the plurality of STI regions and forming the tip recess simultaneously. The steps of forming the plurality of STI regions and forming the tip recess may comprise forming a masking material over the workpiece, patterning the masking material, etching the workpiece using the masking material as an etch mask to form the tip recess and recesses for the plurality of STI regions, removing the masking material, forming an insulating material over the workpiece, removing the insulating material from over a top surface of the workpiece, and removing the insulating material from the tip recess. The step of patterning the semiconductive material may comprise forming a substantially continuous region of the semiconductive material that comprises the gate of the transistor, the second plate of the first capacitor, and the second plate of the second capacitor.

Another representative embodiment of a method of manufacturing a memory device comprises: forming a transistor having a gate disposed over a surface of a workpiece, and a source region and a drain region disposed in the workpiece proximate the gate, the source region and the drain region each extending from the surface of the workpiece into the workpiece; forming an erase gate including a tip portion that extends in a recess in the workpiece, the recess extending from the surface of the workpiece into the workpiece, wherein the erase gate directly contacts the gate of the transistor; and forming a coupling gate over the workpiece, the coupling gate directly contacting the gate of the transistor. The step of forming the transistor may comprise integrally connecting the gate of the transistor to the erase gate. The method may further comprise disposing an insulating material between the tip portion of the erase gate and the workpiece. The insulating material may comprise a deposition of the insulating material to a thickness of about 70 Å or greater. The step of forming the erase gate may comprise extending the tip portion of the erase gate below a bottom surface of the gate of the transistor by about 50 Å to about 3,000 Å. The step of forming the transistor may comprise integrally connecting the gate of the transistor to the coupling gate.

In yet another representative embodiment, a method of manufacturing memory device comprises: forming a conductive electrode on a workpiece, the conductive electrode extending across a first region of the workpiece, a second region of the workpiece, and a third region of the workpiece; forming a first capacitor in the first region of the workpiece, the first capacitor comprising a first electrode in the workpiece and an erase gate electrode, the erase gate electrode being a first portion of the conductive electrode on the workpiece, the conductive electrode extending into a recess in the workpiece in the first region; forming a transistor in the second region of the workpiece, the transistor comprising a source/drain region in the workpiece and a gate, the gate being a second portion of the conductive electrode on the workpiece; and forming a second capacitor in the third region of the workpiece, the second capacitor comprising a second electrode in the workpiece and a coupling gate electrode, the coupling gate electrode being a third portion of the conductive electrode on the workpiece. The step of forming the conductive electrode may comprise forming a floating conductive electrode. The method may further comprise disposing a dielectric layer between the conductive electrode and the workpiece. The step of forming the first capacitor may comprise forming the recess to have a v-shaped cross section. The step of forming the first capacitor may comprise forming the first electrode in a first doped region of the workpiece, and forming the second electrode in a second doped region of the workpiece. The step of forming the conductive electrode may comprise forming an L-shaped cross section of the conductive electrode in a plane parallel to a top surface of the workpiece. The step of forming the conductive electrode may comprise forming a rectangular shaped cross section of the conductive electrode in a plane parallel to a top surface of the workpiece. The step of forming the first capacitor may comprise extending a tip portion of the erase gate electrode below a bottom surface of the gate of the transistor by about 50 Å to about 3,000 Å.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a memory device, the method comprising:
   patterning a substrate to form a first recess and a second recess using a first etching process;
   patterning the substrate to form a third recess using a second etching process;
   filling the first recess and the second recess with a dielectric material to form a first isolation region and a second isolation region, the first isolation region being interposed between a first region of the substrate and a second region of the substrate, the second isolation region interposed between the second region and a third region of the substrate, wherein the third recess is in the first region;
   doping the substrate along sidewalls of the third recess;
   doping the substrate in the third region;
   forming source/drain regions in the second region;
   forming a dielectric layer over the first region, the second region, and the third region; and
   forming a conductive layer over the dielectric layer in the first region, the second region, and the third region of the substrate, wherein the conductive layer comprises a plate of a first capacitor in the first region, a gate of a transistor in the second region, and a plate of a second capacitor in the third region.

2. The method of claim 1, wherein the third recess is V-shape.

3. The method of claim 2, wherein an upper periphery of the V-shape has a length and width is less than or equal to 0.5 μm.

4. The method of claim 2, wherein a lower periphery of the V-shape has a length and width from equal to 0.1 μm to equal to 0.2 μM.

5. The method of claim 1, wherein forming the conductive layer in the first region, the second region, and the third region comprises forming the conductive layer to have a first length in the first region different than a second length in the third region.

6. The method of claim 5, wherein forming the conductive layer in the first region, the second region, and the third region comprises forming the conductive layer to have a third length in the second region different than the second length in the third region.

7. The method of claim 6, wherein the first length and the third length is less than the second length.

8. A method of manufacturing a memory device, the method comprising:
forming a tip recess in a first region in a substrate using a first etch process;
forming a first isolation region and a second isolation region in the substrate using a second etch process, the substrate having a second region and a third region, the second region being interposed between the first isolation region and the second isolation region, the third region being on an opposing side of the second isolation region from the first isolation region;
forming a first plate of a first capacitor in the tip recess;
forming a first plate of a second capacitor in the third region;
forming source/drain regions of a transistor in the second region;
forming an insulating layer over the first plate of the first capacitor, the source/drain regions, and the first plate of the second capacitor; and
forming a semiconductor layer over the insulating layer over the first plate of the first capacitor, the source/drain regions, and the first plate of the second capacitor, wherein the semiconductor layer is a second plate of the first capacitor, a gate of the transistor, and a second plate of the second capacitor.

9. The method of claim 8, wherein a depth of the tip recess is 0.2 μm or less.

10. The method of claim 8, wherein the semiconductive layer extends 50 Å to about 3,000 Å below an upper surface of the insulating layer adjacent the tip recess.

11. The method of claim 8, wherein a length of the second plate of the second capacitor is twice a length of the second plate of the first capacitor.

12. The method of claim 8, wherein the first plate of the first capacitor and the first plate of the second capacitor are doped regions of the substrate.

13. The method of claim 12, wherein a depth of the first plate and a depth of the second plate is greater than a depth of the source/drain regions.

14. A method of manufacturing a memory device, the method comprising:
patterning a substrate to form a first recess and a second recess using a first etching process;
patterning the substrate to form a third recess using a second etching process, wherein the third recess is V-shape;
filling the first recess and the second recess with a dielectric material to form a first isolation region and a second isolation region, the first isolation region being interposed between a first region of the substrate and a second region of the substrate, the second isolation region interposed between the second region and a third region of the substrate, wherein the third recess is in the first region;
doping the substrate along sidewalls of the third recess;
doping the substrate in the third region;
forming source/drain regions in the second region;
forming a dielectric layer over the first region, the second region, and the third region; and
forming a conductive layer over the dielectric layer in the first region, the second region, and the third region of the substrate, wherein the conductive layer comprises a plate of a first capacitor in the first region, a gate of a transistor in the second region, and a plate of a second capacitor in the third region, wherein forming the conductive layer in the first region, the second region, and the third region comprises forming the conductive layer to have a first length in the first region different than a second length in the third region.

15. The method of claim 14, wherein an upper periphery of the V-shape has a length and width less than or equal to 0.5 μm.

16. The method of claim 14, wherein a lower periphery of the V-shape has a length and width from equal to 0.1 μm to equal to 0.2 μM.

17. The method of claim 14, wherein forming the conductive layer in the first region, the second region, and the third region comprises forming the conductive layer to have a third length in the second region different than the second length in the third region.

18. The method of claim 17, wherein the first length and the third length is less than the second length.

19. The method of claim 14, wherein a depth of the third recess is 0.2 μm or less.

20. The method of claim 14, wherein patterning the substrate to form the third recess is performed prior to patterning the substrate to form the first recess and the second recess.

* * * * *

UNITED STATES PATENT AND TRADEMARK OFFICE
CERTIFICATE OF CORRECTION

PATENT NO. : 10,510,902 B2  
APPLICATION NO. : 16/055405  
DATED : December 17, 2019  
INVENTOR(S) : Kalnitsky Page 1 of 1

It is certified that error appears in the above-identified patent and that said Letters Patent is hereby corrected as shown below:

In the Claims

In Column 14, Line 41, Claim 16, delete "0.2 µM" and insert --0.2 µm--.

Signed and Sealed this  
Fourteenth Day of April, 2020

Andrei Iancu  
*Director of the United States Patent and Trademark Office*